US008848381B2

(12) United States Patent
Borghoff

(10) Patent No.: US 8,848,381 B2
(45) Date of Patent: Sep. 30, 2014

(54) POWER SEMICONDUCTOR MODULE AND POWER SEMICONDUCTOR MODULE SYSTEM

(75) Inventor: Georg Borghoff, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 174 days.

(21) Appl. No.: 13/372,851

(22) Filed: Feb. 14, 2012

(65) Prior Publication Data

US 2012/0293967 A1 Nov. 22, 2012

(30) Foreign Application Priority Data

May 16, 2011 (DE) .......................... 10 2011 075 921

(51) Int. Cl.
*H05K 7/00* (2006.01)
*H01L 25/07* (2006.01)
*H01L 21/50* (2006.01)
*H01R 4/50* (2006.01)
*H01L 23/10* (2006.01)

(52) U.S. Cl.
CPC ....... *H01L 25/072* (2013.01); *H01L 2224/4846* (2013.01); *H01L 2924/13055* (2013.01); *H01L 2224/32225* (2013.01); *H01L 21/50* (2013.01); *H01L 2224/48472* (2013.01); *H01L 2224/73265* (2013.01); *H01L 2224/48227* (2013.01); *H01L 2924/3011* (2013.01); *H01R 4/5091* (2013.01); *H01L 2924/13091* (2013.01); *H01L 23/10* (2013.01)
USPC .......................................... 361/747; 361/784

(58) Field of Classification Search
USPC ............ 361/747, 679.01, 720, 748, 760, 784, 361/803, 807, 809, 810; 165/185; 257/678, 257/679
See application file for complete search history.

(56) References Cited

U.S. PATENT DOCUMENTS

| | | | | |
|---|---|---|---|---|
| 4,318,157 A * | 3/1982 | Rank et al. ................... | 361/704 |
| 4,475,145 A * | 10/1984 | Heil et al. ..................... | 361/720 |
| 6,623,279 B2 * | 9/2003 | Derian et al. .................. | 439/74 |
| 7,197,806 B2 * | 4/2007 | Boudreaux et al. ............ | 29/434 |
| 7,450,400 B2 * | 11/2008 | Boudreaux et al. ........... | 361/809 |
| 7,602,619 B2 * | 10/2009 | Fabrizi et al. ................. | 361/807 |
| 7,656,016 B2 * | 2/2010 | Yoshimatsu et al. .......... | 257/686 |
| 8,526,189 B2 * | 9/2013 | Yamanaka et al. ............ | 361/733 |

FOREIGN PATENT DOCUMENTS

| | | |
|---|---|---|
| DE | 102006027482 B3 | 8/2007 |
| DE | 102008048505 A1 | 6/2009 |
| DE | 102008049193 A1 | 1/2011 |

* cited by examiner

*Primary Examiner* — Hung S Bui
(74) *Attorney, Agent, or Firm* — Murphy, Bilak & Homiller, PLLC

(57) ABSTRACT

A power semiconductor module includes an electrically conductive connecting element, an accommodating region, and a clamping element which can be brought from a first position into a second position. If the clamping element is situated in the first position, a connecting region of a module-external connecting conductor can be inserted into the accommodating region and be clamped to the power semiconductor module with the formation of an electrically conductive connection between the connection region and the connecting element. For this purpose, the clamping element is brought from the first position into the second position.

20 Claims, 8 Drawing Sheets

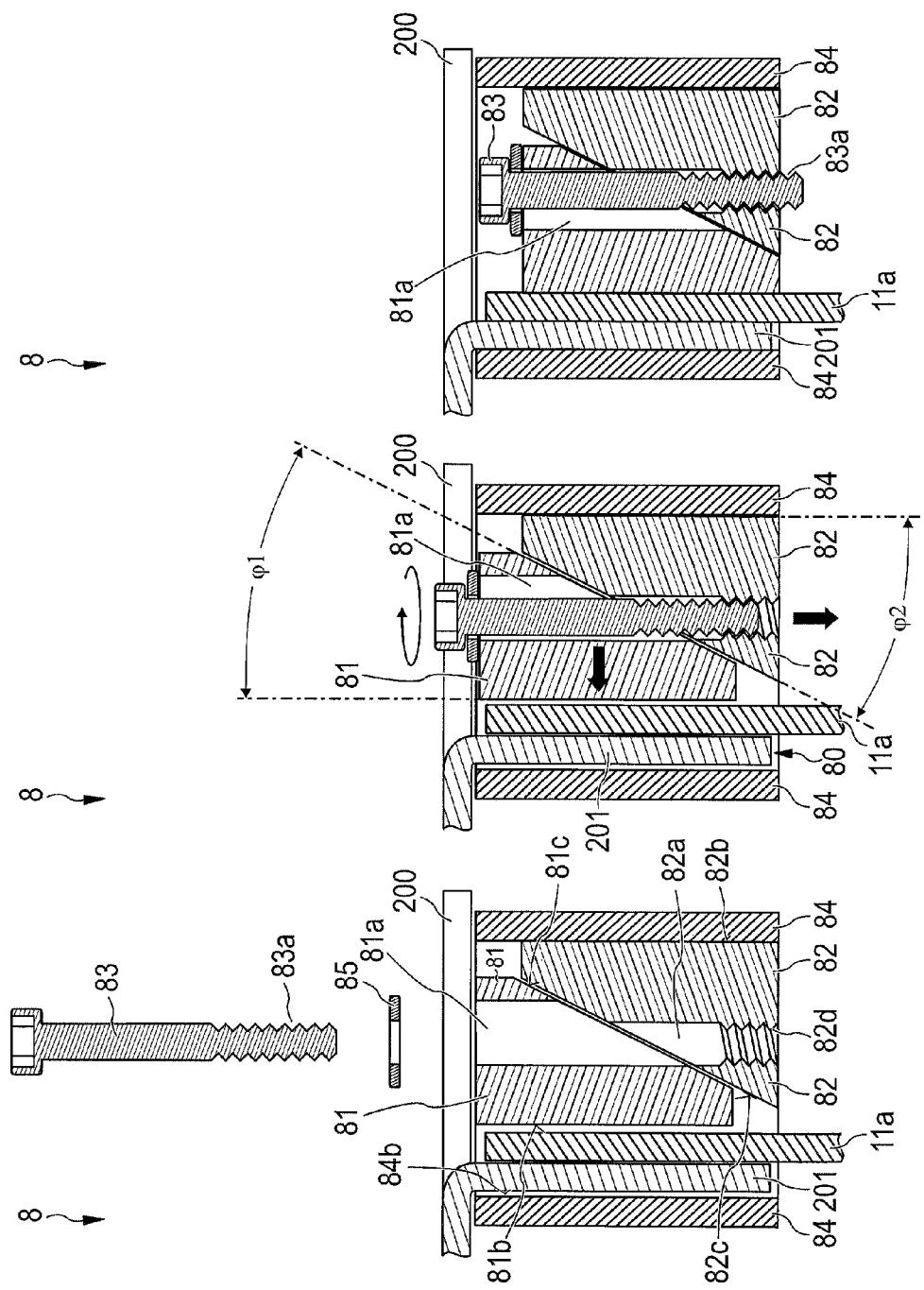

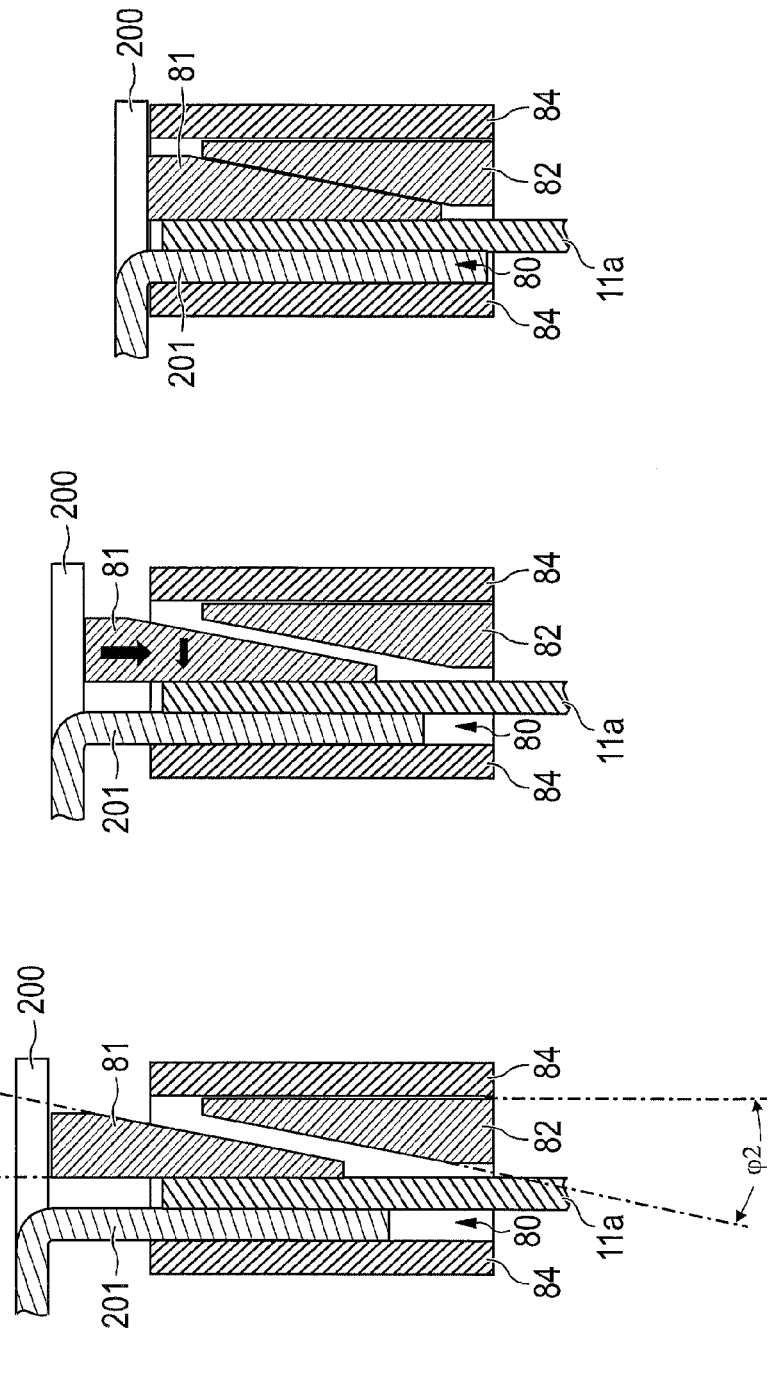

POWER SEMICONDUCTOR MODULE AND POWER SEMICONDUCTOR MODULE SYSTEM

PRIORITY CLAIM

This application claims priority to German Patent Application No. 10 2011 075 921.2 filed on 16 May 2011, the content of said application incorporated herein by reference in its entirety.

TECHNICAL FIELD

The present application relates to power semiconductor modules.

BACKGROUND

Power semiconductor modules which are supplied with high currents and/or which provide high output currents are usually connected to a voltage supply or a load with the aid of low-impedance connecting conductors. For this purpose, the connecting conductors are screwed to corresponding connecting elements of the power semiconductor module.

The screw joint is often realized by the fact that an end of the connecting element that is accessible from the outer side of the module is led parallel to the housing wall and is provided with a hole in this region. Below the connecting element, a screw nut is placed behind the hole, the screw nut being inserted into a depression in the housing. The corresponding connections of the connecting conductor are likewise perforated and are screwed to the connecting element of the module by a screw, by virtue of the screw being screwed into the screw nut. For mounting purposes, therefore, firstly a screw nut must be inserted into a depression on the housing and the end of the connecting element that is provided with the hole must be bent across the inserted screw nut. Afterward, the hole in the connecting conductor must be positioned with accurate register above the hole in the connecting element, and a screw must be led through the two holes and screwed to the screw nut. It may also possibly be necessary to fit a washer in order to transmit the force from the screw uniformly to the connecting conductor. On account of the large number of processing steps, the mounting of the connecting conductor on the power semiconductor module is conventionally highly complex and thus cost-intensive.

Moreover, in the region of the screw joint, there is only a small contact zone between the connecting conductor and the connecting element, for which reason the location of the screw joint limits the current via the connecting element and the connecting conductor. The same correspondingly also applies to heat conduction, since the operating heat that arises in a power semiconductor module is, to a certain degree, also dissipated via its connecting elements and the connecting conductors connected thereto.

SUMMARY

A power semiconductor module according to an embodiment includes a power semiconductor chip, an electrically conductive connecting element, an accommodating region, and a clamping element, which can be brought from a first position into a second position. If the clamping element is situated in the first position, a connecting region of a module-external connecting conductor can be inserted into the accommodating region. If the clamping element is then brought from the first position into the second position, the connecting region is clamped to the power semiconductor module with the formation of an electrically conductive connection between the connecting region and the connecting element. On account of this clamping technique, a through-hole in the connecting conductor and the connecting region can be dispensed with, such that the regions which are provided with a hole in conventional power semiconductor modules and module-external connecting conductors are also available for electrical and thermal contact-making between the connecting element and the connecting region.

The connecting conductor with its accommodating region is not part of the power semiconductor module. Such a power semiconductor module together with a module-external connecting conductor forms a power semiconductor module system.

Those skilled in the art will recognize additional features and advantages upon reading the following detailed description, and upon viewing the accompanying drawings.

BRIEF DESCRIPTION OF THE DRAWINGS

The invention is explained in greater detail below on the basis of exemplary embodiments with reference to the accompanying figures. Unless mentioned otherwise, in the figures identical reference symbols designate identical or similar elements having the same or a similar function. In the figures:

FIG. 6 shows a vertical section through a clamping device of a power semiconductor module into which a connecting region of a module-external connecting conductor has been inserted, prior to clamping;

FIG. 7 shows the arrangement in accordance with FIG. 6 during clamping;

FIG. 8 shows the arrangement in accordance with FIGS. 6 and 7 after clamping;

FIG. 9 shows an arrangement corresponding to FIG. 6 with the difference that the clamping device is self-locking;

FIG. 10 shows the arrangement in accordance with FIG. 9 during clamping;

FIG. 11 shows the arrangement in accordance with FIGS. 9 and 10 after clamping;

DETAILED DESCRIPTION

Two basic types of power semiconductor modules are firstly explained by way of example with reference to FIGS.

1A and 1B. However, the internal construction of the power semiconductor modules can be chosen in a deviating fashion and can be adapted to a circuit to be realized with the power semiconductor module.

Figure 1:
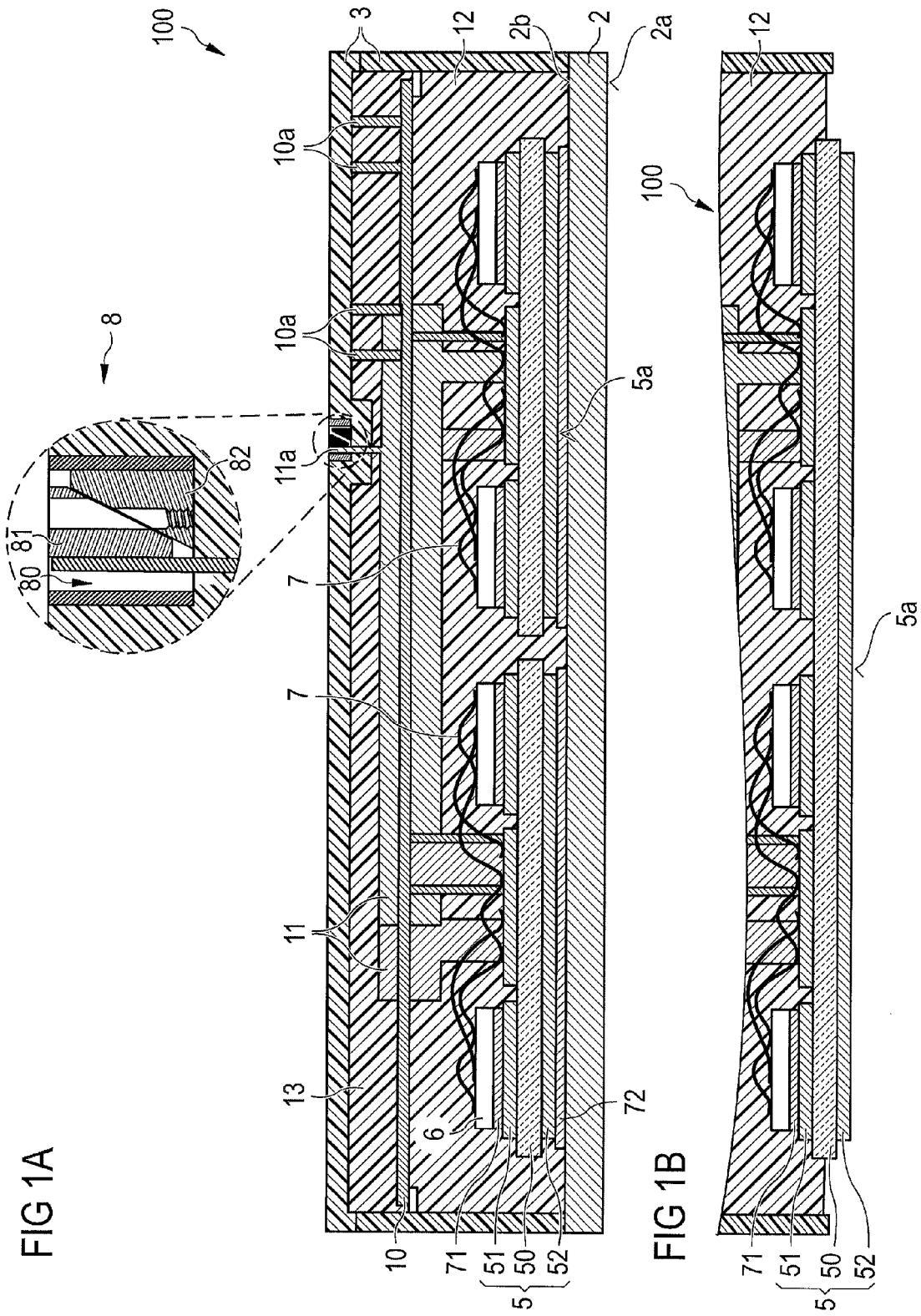
FIG. 1A shows a vertical section through a power semiconductor module with a solid baseplate.
FIG. 1B shows a vertical section through a portion of a power semiconductor module whose baseplate is formed by a metallized ceramic carrier substrate.

FIG. 1A shows a vertical section through a power semiconductor module 100. The power semiconductor module 100 includes at least one power semiconductor chip 6, each of which is arranged on a circuit carrier 5. In this case, one or a plurality of power semiconductor chips 6 can be incorporated on a circuit carrier 5. A power semiconductor chip 6 can be, for example, a controllable power semiconductor switch such as e.g. a MOSFET, an IGBT, a J-FET or a thyristor, or a diode. In principle, the power semiconductor module 100 includes at least one such power semiconductor chip 6.

The circuit carrier 5 includes an insulation carrier 50 provided with an upper metallization 51 and with a lower metallization 52. The insulation carrier 50 can be, for example, a ceramic such as e.g. aluminum oxide ($Al_2O_3$), aluminum nitride (AlN) or silicon nitride ($Si_3N_4$). The upper metallization 51 and the lower metallization 52 consist of material having good electrical conductivity such as, for example, copper, aluminum or alloys comprising at least one of these metals. A circuit carrier 5 can be e.g. a DCB substrate (DCB=direct copper bonding), a DAB substrate (DAB=direct aluminum bonding) or an AMB substrate (AMB=active metal brazing). The power semiconductor module 100 can include no, exactly one or else a plurality of such circuit carriers 5.

In order that the power semiconductor chips 6 are fixed on a circuit carrier 5 and electrically conductively connected to the upper metallization 51 thereof, a first connection layer 71 is provided, which can be, for example, a solder layer, in particular a diffusion solder layer, an adhesive layer including an electrically conductive adhesive or a sintered connection layer comprising silver. On their top sides facing away from the relevant circuit carrier 5, the power semiconductor chips 6 can be electrically conductively contact-connected and electrically conductively connected to other components of the power semiconductor modules 100 by means of any desired connecting techniques. In the exemplary embodiment shown in accordance with FIG. 1A, bonding wires 7 are used for this purpose, which are bonded onto the top sides of the power semiconductor chips 6 facing away from the circuit carriers 5 and onto portions of the upper metallization 51 of the relevant circuit carrier 5. Instead of or in addition to bonding wires, it is also possible to use soldered or bonded metal tapes or sheets. There is likewise the possibility of producing electrically conductive connections by pressure contact-connection with the top sides of the power semiconductor chips 6 and/or with portions of the upper metallization 51.

As can additionally be gathered from the embodiment illustrated in FIG. 1A, the optional busbar systems 11 can be provided for the internal interconnection of the power semiconductor module 100. The busbar systems 11 can be electrically conductively connected to specific ones of the power semiconductor chips 6. The busbar systems 11 have connecting regions 11a serving for external electrical contact-connection of the power semiconductor module 100. For this purpose, the connecting regions 11a are accessible from the outer side of a housing 3 having a frame and a cover.

A printed circuit board 10 can optionally be arranged above the circuit carriers 5 equipped with the power semiconductor chips 6. The printed circuit board 10 can be used at least for one of the purposes explained below. One possible purpose of use consists in the fact that control lines and/or signal lines, that is to say lines via which comparatively low currents flow in comparison with the load currents switched by the power semiconductor module 100, are tapped from the circuit carriers 5 and led by redistribution wiring via the printed circuit board 10 and led with the aid of further connecting elements 10a to the outer side of the power semiconductor module 100. Optionally, further electronic components such as, for example, driving and/or monitoring electronics for driving and/or monitoring the power semiconductor chips 6 can be provided on the printed circuit board 10. External signals, for example for driving the controllable power semiconductor chips 6, can also be fed to the power semiconductor module 100 via corresponding connecting elements 10a.

In order, during the operation of the power semiconductor module 100, to ensure the electrical insulation within the power semiconductor module 100 and to avoid electrical flashovers between elements at greatly different electrical potentials, the module interior can be wholly or partly potted with a soft potting compound 12, for example a silicone gel. In this case, the soft potting compound 12 extends at least from the baseplate 2 over all the power semiconductor chips 6. In addition, an optional hard potting compound 13, for example a casting resin, which, inter alia, stabilizes the printed circuit board 10 and/or the busbar system 11, can be provided above the soft potting compound 12.

The power semiconductor module 100 illustrated in FIG. 1A is a power semiconductor module which includes a solid baseplate 2, on which the circuit carriers 5 equipped with the power semiconductor chips 6 are arranged. A solid baseplate 2 of this type can have, for example, a thickness in the range of 2 mm to 5 mm. Suitable materials for the baseplate 2 include e.g. metals having good thermal conductivity such as copper or copper alloys, or aluminum or aluminum alloys. Metal-matrix composites (MMCs) such as aluminum silicon carbide (AlSiC) can likewise be used.

The equipped circuit carriers 5 can be connected to the baseplate 2 at their lower metallizations 52 by means of second connection layers 72. The second connection layers 72 can be, for example, solder layers, in particular diffusion solder layers, adhesive layers or sintering layers comprising silver. The baseplate 2 serves for dissipating the operating heat that arises in the power semiconductor chips 6 via a heat dissipating contact area 2a to a heat sink (not shown) that can be contact-connected to the heat dissipating contact area 2a. For this purpose, a heat flow takes place proceeding from the power semiconductor chips 6 via the relevant first connection layers 71, the relevant circuit carrier 5, the relevant second connection layer 72, and the baseplate 2. In order to achieve a lowest possible heat transfer resistance of the baseplate 2, it is advantageous if the latter consists of a material having good conductivity, for example copper or a copper alloy comprising a copper proportion of at least 90% by weight. However, the baseplate 2 can also consist of aluminum or an aluminum alloy, which can optionally have a coating, for example in order to improve solderability, if the top side 2b of the baseplate that faces the circuit carriers 5 is intended to be soldered or sintered to the lower metallization 52 of the circuit carriers 5. In the case of a soldered connection, by way of example, a nickel coating is suitable; for a sintering connection, a coating composed of noble metal, for example silver or gold, is suitable. The thickness of the baseplate 2 can be in the range of 2 mm to 5 mm, for example. The thicknesses of the insulation carriers 50 can be e.g. 0.25 mm to 1 mm, the thickness of the upper metallization 51 can be e.g. 0.2 mm to 0.5 mm, and the thickness of the lower metallization 52 can be e.g. 0.2 mm to 0.5 mm. In this case, the stated values can be chosen independently of one another and can be combined with one another in any desired manner.

FIG. 1B shows a vertical section through a so-called "baseplateless" power semiconductor module 100. The construction thereof corresponds, in principle, to the module 100 explained with reference to FIG. 1A. It differs therefrom merely in that no solid metallic baseplate 2 is provided, but rather a circuit carrier 5, the construction of which can correspond to the construction of the circuit carriers 5 explained with reference to FIG. 1A, constitutes the baseplate of the power semiconductor module 100. In particular, the underside 5a of the lower metallization 52 of the circuit carrier 5 that faces away from the power semiconductor chips 6 forms the heat dissipating contact area 5a of the power semiconductor module 100, which can be contact-connected to a heat sink (not illustrated).

Both in the case of the power semiconductor module 100 in accordance with FIG. 1A and in the case of the power semiconductor module 100 in accordance with FIG. 1B, the coupling of a heat sink to the heat dissipating contact area 2a and 5a, respectively, can be effected by means of a thermally conductive paste introduced areally between the heat sink and the relevant heat dissipating contact area 2a and 5a, respectively.

In order that a power semiconductor module 100 such as has been explained by way of example with reference to FIGS. 1A and 1B is electrically conductively connected to a supply voltage or to a load, a connecting element 11a of the power semiconductor module 100 can be provided with a clamping device 8 such as is illustrated in an enlarged fashion in FIG. 1A. Possible configurations of such a clamping device 8 are explained in greater detail below on the basis of exemplary embodiments.

Figure 2:
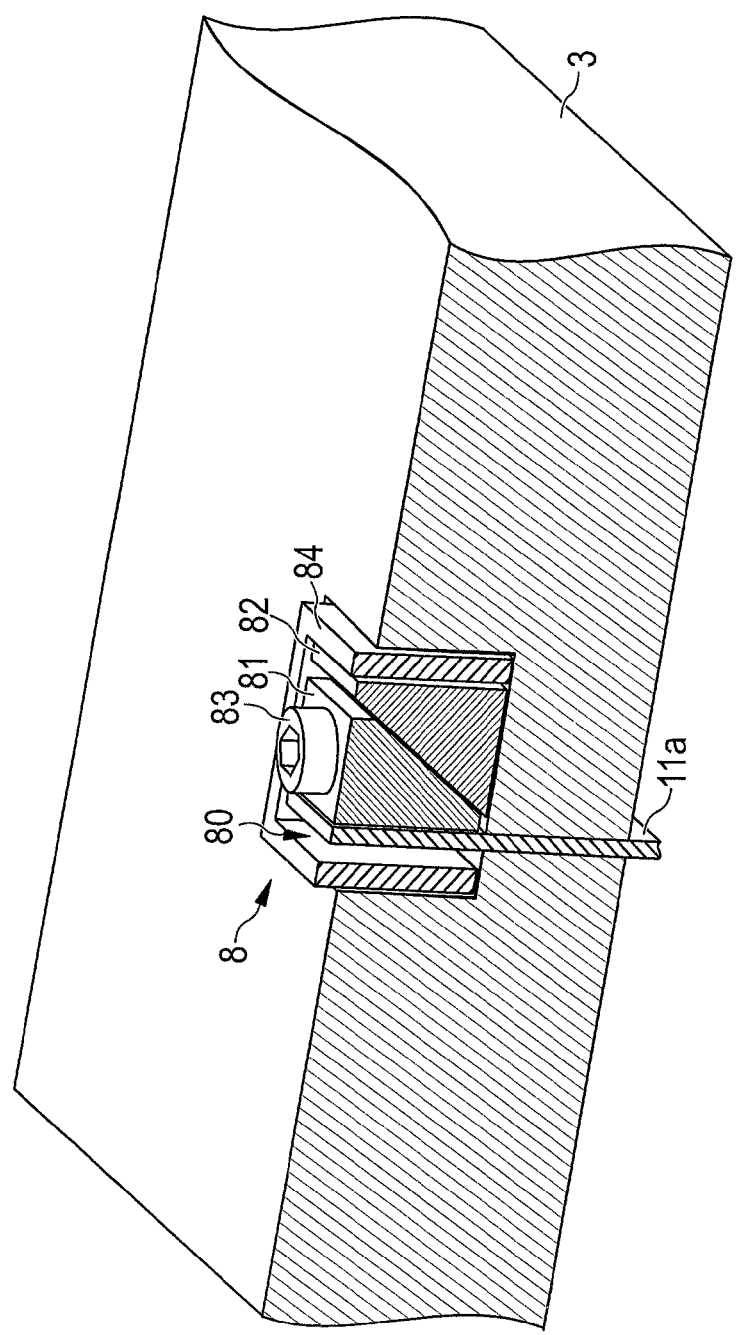
FIG. 2 shows a perspective sectional view of a portion of a power semiconductor module with a clamping device for connecting a module-external connecting conductor.
Figure 4:
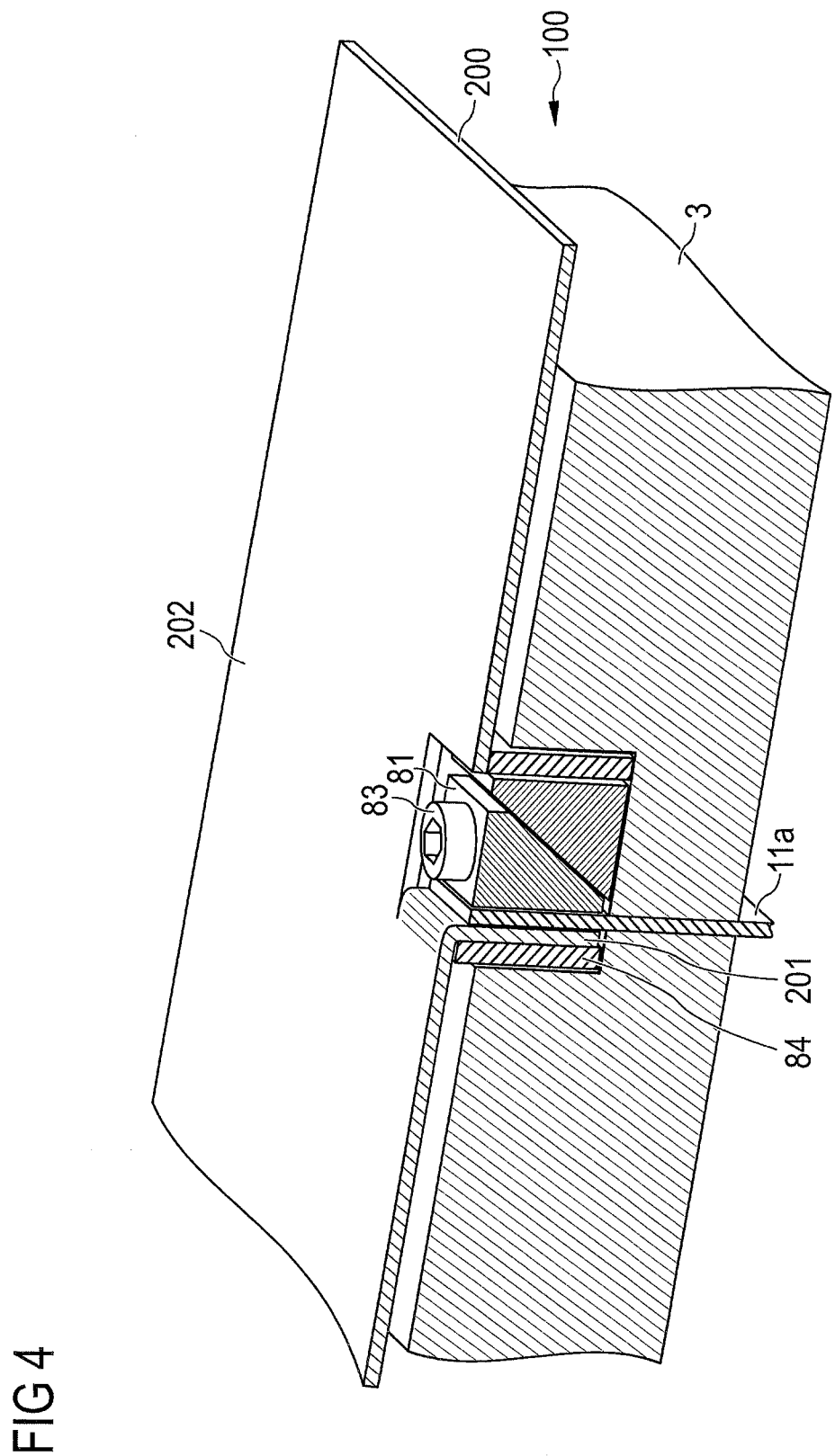
FIG. 4 shows the portion of the power semiconductor module in accordance with FIG. 2 with a connected module-external connecting conductor in accordance with FIG. 3.
Figure 5:
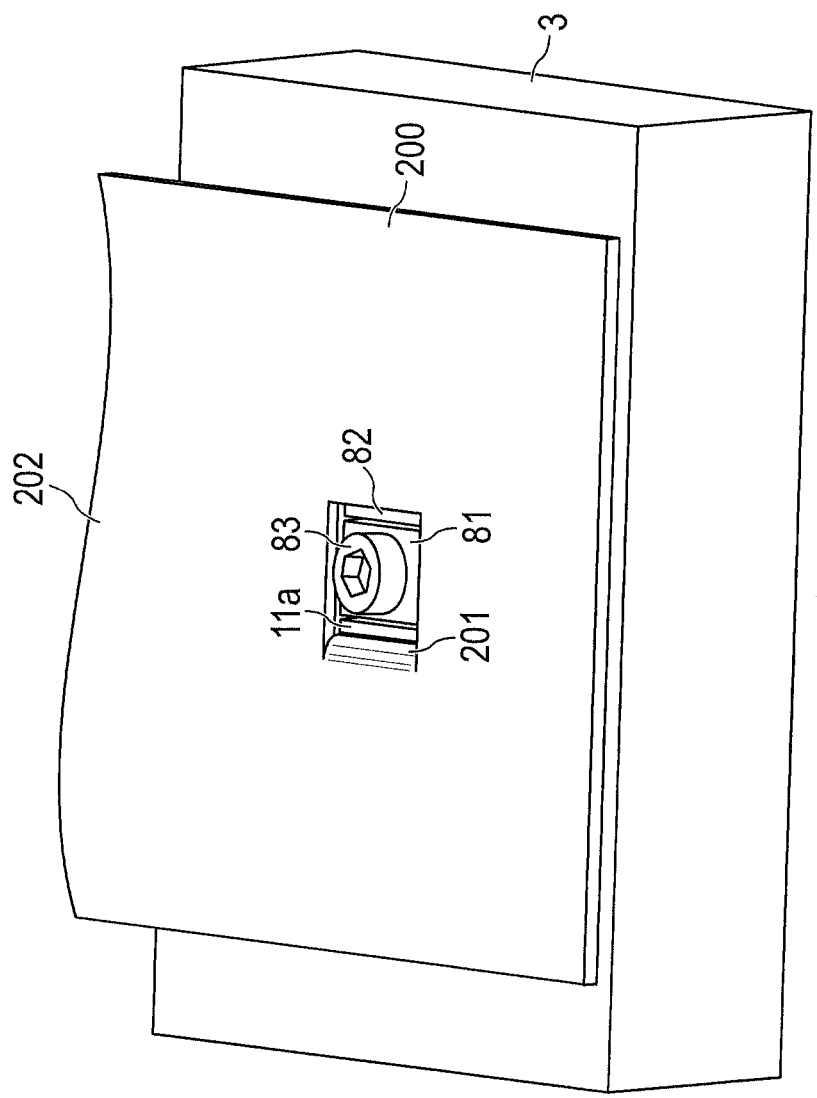
FIG. 5 shows a perspective view of the module-external connecting conductor fixedly clamped to the power semiconductor module.

FIG. 2 shows an enlarged portion of a housing cover 3 of a power semiconductor module, into which a clamping device 8 has been inserted. The clamping device 8 includes a clamping element 81, which is embodied by way of example as a clamping wedge, an optional counter-wedge 82, an optional screw 83, and a likewise optional clamping jaw 84. A connecting element 11a proceeding from the module inner side, which connecting element 11a can be electrically conductively connected to a power semiconductor chip 6, for example, extends at least as far as the level of the clamping wedge 81. An accommodating region 80 remains between the connecting element 11a and the clamping jaw 84, into which accommodating region 80 a connecting region 201 of a module-external connecting conductor 200 shown in FIG. 3 can be inserted and subsequently clamped to the connecting element 11a with the formation of an electrically conductive contact. FIG. 4 shows that portion of the power semiconductor module 100 which is illustrated in FIG. 2 after the connection thereof to the external connecting conductor 200 illustrated in FIG. 3, in sectional view, and FIG. 5 shows a corresponding perspective plan view.

Figure 3:
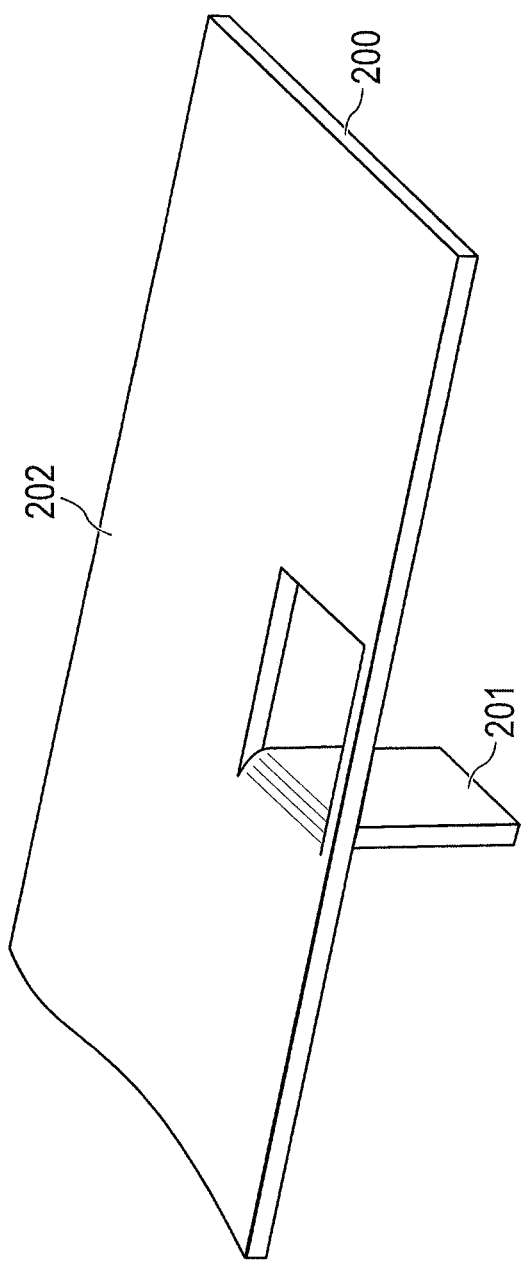
FIG. 3 shows a perspective view of a portion of a module-external connecting conductor which can be used for electrically connecting a power semiconductor module.

The connecting conductor 200 in accordance with FIG. 3 has a flat connecting region 201, which is not provided with a through-opening such as is provided in the case of conventional connecting conductors. As a result, the entire area of the connecting region 201 is available for making electrical contact with the connecting element 11a. Accordingly, the connecting element 11a also does not have to have a through-opening at its end used for making contact with the connecting region 201. As a result, both the electrical and thermal contact resistance between the connecting region 201 and the connecting element 11a can be significantly reduced by comparison with conventional arrangements.

As can be discerned with reference to FIG. 3, a connecting region 201 of a module-external connecting conductor 200 can be produced by virtue of the fact that, in a substantially planar portion 202 of a metal sheet, the later connecting region 201 is bent over relative to the planar region 202 by a predetermined angle, for example 90°, such that a connecting lug projecting from the planar portion 202 arises, which forms the connecting region 201. For this purpose, the later connecting region 201, prior to being bent over, can be separated from the rest of the planar portion 202, which can be done for example by means of stamping, by means of laser cutting or by means of water jet cutting. In the example shown, the connecting region 201 was separated from the planar portion 202 in the inner region of the metal sheet 200. In a departure from this, however, the connecting region 201 could also be situated at an end of the connecting conductor 200, such that the connecting conductor 200 has no opening left by the connecting region 201 after being bent over.

FIG. 6 shows a vertical section through a clamping device 8, with the aid of which a connecting element 11a of a power semiconductor module 100 and a connecting region 201 of a module-external connecting conductor 200 are clamped to one another with the formation of an electrically conductive connection. FIG. 6 shows the arrangement prior to clamping. The clamping element 81, embodied as a clamping wedge, has a bushing 81a, through which a screw 83 provided with thread 83a can be led. The counter-wedge 82 includes an internal thread 82d and an optional bushing 82a. The thread 83a of the screw 83 is coordinated with the internal thread 82d and can be screwed into the latter when the screw 83 is led through the passage region 81a.

In FIG. 6, the clamping element 81 is situated in a first position, that is to say in a position which makes it possible for the connecting region 201 of the connecting conductor 200 to be inserted into the accommodating region 80 of the clamping device 8. If the screw 83, optionally with the use of a washer 85, is then led through the passage region 81a and screwed into the internal thread 82d, then the clamping element 81 moves, as illustrated in FIG. 7 with the aid of two black arrows, on account of the geometries of the clamping element 81 and of the counter-wedge 82 in the direction of the counter-wedge 82 and in the direction of the connecting element 11a and the connecting region 201, such that, as is shown as the result in FIG. 8, the connecting element 11a and the connecting region 201 are clamped to one another between the clamping element 81 and the clamping jaw 84 with the formation of an electrically conductive connection. After clamping, the clamping element 81 is situated in a second position. In order to enable a displacement of the clamping element 81 relative to the counter-wedge 82, the width of the bushing 81a is chosen to be greater than the diameter of the screw shaft of the screw 83.

The clamping element 81 has a first side surface 81b facing away from the counter-wedge 82, and a first sliding surface 81c facing the counter-wedge 82. Correspondingly, the counter-wedge 82 has a second side surface 82b facing away from the clamping element 81, and a second sliding surface 82c facing the clamping element 81. The first side surface 81b and the first sliding surface 81c can form a first angle $\phi 1$. In this case, the first side surface 81b and/or the first sliding surface 81c can be embodied as planar or substantially planar surfaces.

Correspondingly, the second side surface 82b and the second sliding surface 82c can form a second angle $\phi 2$, which can be greater than, less than, or equal to the first angle $\phi 1$. The second side surface 82b and/or the second sliding surface 82c can also be embodied in planar or substantially planar fashion. The first angle $\phi 1$ and/or the second angle $\phi 2$ can be chosen, in principle, in any desired manner, for example in the range of 10° to 40°.

In order to achieve a contact between the connecting element 11a and a connecting region 201 which is as uniform as possible, the first side surface 81b of the clamping element 81, facing the connecting element 11a, can then run parallel or substantially parallel to a side surface 84b of the clamping jaw 84 if the first sliding surface 81c and the second sliding surface 82c bear against one another, wherein the side surface 84b is chosen such that the connecting element 11a is arranged between it and the clamping element 81.

In the embodiment illustrated in FIGS. 6 to 8, the connecting element 11a is arranged between the accommodating region 80 or the connecting region 201, on the one hand, and the clamping element 81, on the other hand. Alternatively, however, the accommodating region 80 or the connecting region 201 could also be situated between the connecting element 11a and the clamping element 81.

A further configuration of a clamping device 8 is shown in FIGS. 9 to 11. This clamping device 8 differs from the clamping device 8 explained with reference to FIGS. 8 to 10 in that it is self-clamping, that is to say that the clamping device 8 does not have a fixing screw by which the clamping element 81 is secured in its second position. Rather, the clamping element 81 is retained exclusively with the aid of the static friction of the clamping element 81. In order to obtain the clamping effect, the clamping element 81 is merely pushed in the direction of the counter-piece 82 until the desired clamping effect has been achieved. In order to obtain the self-clamping effect, the angle $\phi 1$ is chosen to be very small; it can be chosen to be, for example, greater than 0° and less than or equal to 6°. FIG. 9 shows the clamping element 81 in its first position, and FIG. 11 in its second position.

Figure 12:
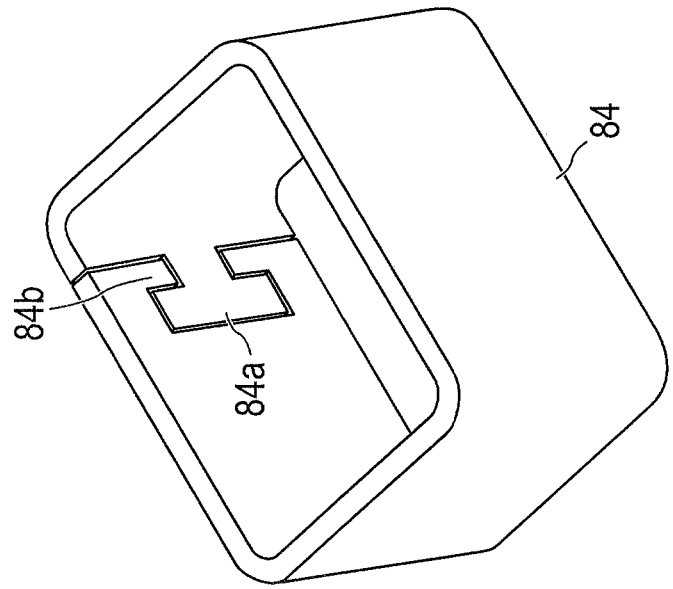
FIG. 12 shows a perspective view of a clamping jaw such as can be used in the clamping devices of a power semiconductor module.

FIG. 12 shows a clamping jaw 84 such as can be used for example in the clamping devices 8 explained above. Since substantially no current flows via the clamping jaw 84, it can be produced from a material which is optimized with regard to its mechanical strength rather than with regard to its electrical resistance, that is to say that the clamping jaw 84 can be produced from a material which has a high Vickers hardness of, for example, more than 200 HV. The material of the clamping jaw 84 can thus have a hardness that is greater than the hardness of the connecting element 11a and, if this is known during the production of the power semiconductor module 100, also greater than the hardness of the connecting region 201. Suitable materials for a connecting element 11a and/or for a connecting region 201 include, for example, copper or a copper alloy, or aluminum or an aluminum alloy.

As is likewise shown in FIG. 12, a clamping jaw 84 can be embodied as a ring. The clamping jaw 84 can, for example, be stamped out from a metal sheet and bent to form a ring. In order to prevent the ring from bending up during the clamping of the connecting element 11a to a connecting region 201a, one end 84a of the clamping jaw 84 can be interlocked with the other end 84b of the clamping jaw 84.

Figure 13:
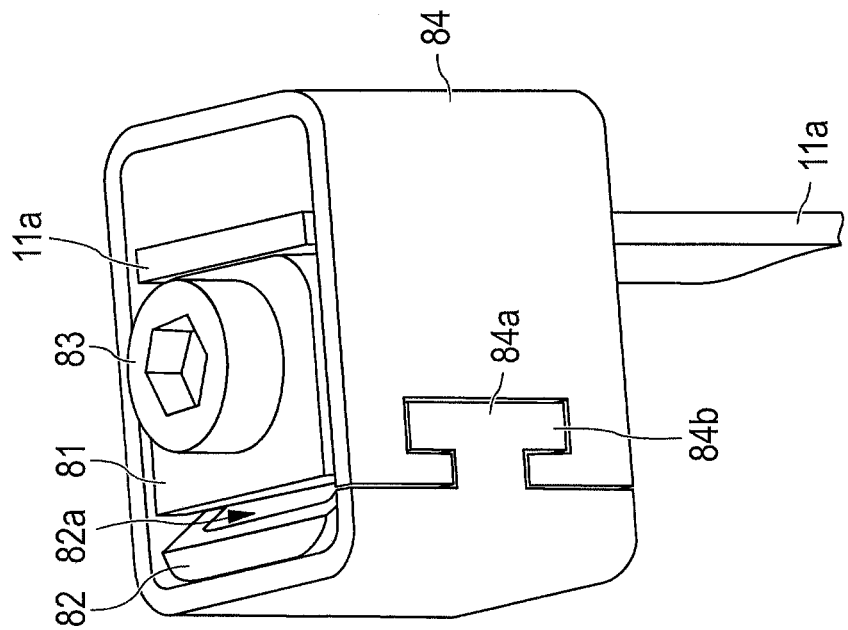
FIG. 13 shows the clamping jaw in accordance with FIG. 12, into which a clamping wedge, a counter-wedge and a connecting element have been inserted.

FIG. 13 shows the clamping jaw 84 in accordance with FIG. 12 after the insertion of a clamping element 81, a counter-wedge 82, a screw 83 and a connecting element 11a. In the case of a clamping device 8 in accordance with FIGS. 6 to 8 and 13, the screw 83, if appropriate in conjunction with the washer 85, can be led through the bushing 81a of the clamping element 81 and partly screwed into the internal thread 82 of the counter-wedge 82, such that these elements are captively connected to one another and can be inserted as one unit into the clamping jaw 84 or else independently of the clamping jaw 84 into a corresponding accommodating region of the module housing 3. In this case, care should merely be taken to ensure that the connecting element 11a is inserted at the correct location between the clamping element 81 and the clamping jaw 84. In order to ensure the captive configurability, a clamping element 81 as shown in FIGS. 6 to 8 can be embodied either as a closed ring enclosing the bushing 81a, or else as an open ring having a gap whose width is less than the diameter of the shaft of the screw 83.

Afterward, a module-external connecting conductor 200 can be inserted by its connecting region 201 into the accommodating region 80 and be electrically conductively contact-connected to the connecting element 11a as explained with reference to FIGS. 6 to 8.

In the previous exemplary embodiments, the clamping jaw 84 and the counter-wedge 82 were embodied as separate elements. As an alternative thereto, the counter-wedge 82 and the clamping jaw 84 can, however, also be embodied integrally or be fixedly connected to one another, for example by screwing, soldering or welding. If the housing 3 of the power semiconductor module 100 has a sufficient stability, it is also possible, moreover, to dispense with a separate clamping jaw. In this case, the module housing 3 performs the function of a clamping jaw.

If a clamping jaw 84 is provided, it can be inserted into a prepared cutout or depression on the housing 3. As an alternative thereto, a clamping jaw can also be injection-molded or cast into the housing 3 during the production thereof. The clamping element 81 and/or counter-wedge 82 can subsequently be inserted into the housing 3 previously equipped with the clamping jaw 84, or else as a composite unit which, besides the clamping element 81 and the counter-wedge 82, also includes the clamping jaw 84 and optionally a connection screw 83. If a connection screw 83 is provided, the clamping element 81 and the counter-wedge 82 can also be screwed to one another non-captively or captively with the connection screw 83 even before the insertion of the unit into the depression or cutout.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor module, comprising:
   an electrically conductive connecting element; and
   a clamping device comprising an accommodating region and a clamping element, the clamping element configured to be brought from a first position into a second position, the accommodating region configured to receive a connecting region of a module-external connecting conductor when the clamping element is situated in the first position, and wherein the clamping device is configured to form an electrically conductive connection by clamping the electrically conductive connecting element to the connecting region of the module-external connecting conductor upon insertion of the connecting region into the accommodating region and the clamping element being subsequently brought from the first position into the second position by a first substantially planar surface of the clamping element sliding across a second substantially planar surface of the clamping device so as to displace the clamping element towards the connecting region of the module-external connecting conductor.

2. The power semiconductor module as claimed in claim 1, wherein the clamping element is a clamping wedge.

3. The power semiconductor module as claimed in claim 2, further comprising a counter-wedge, wherein the clamping wedge has a first side surface facing away from the counter-wedge and a first sliding surface facing the counter, and wherein the counter-wedge has a second side surface facing away from the clamping wedge and a second sliding surface facing the clamping wedge.

4. The power semiconductor module as claimed in claim 3, wherein the first side surface and the first sliding surface form a first angle in a range of 0° to 6° or in a range of 10° to 40°.

5. The power semiconductor module as claimed in claim 4, wherein the second side surface and the second sliding surface form a second angle equal to the first angle.

6. The power semiconductor module as claimed in claim 3, wherein the clamping wedge is self-holding such that with the exception of the second sliding surface the clamping wedge has no holding means configured to hold the clamping wedge in the second position.

7. The power semiconductor module as claimed in claim 1, further comprising a screw joint configured to bring the clamping element from the first position into the second position and permanently hold the clamping element in the second position.

8. The power semiconductor module as claimed in claim 1, further comprising a clamping jaw configured to press the connecting region of the module-external connecting conductor against the clamping jaw upon the clamping element being situated in the second position.

9. The power semiconductor module as claimed in claim 8, wherein the clamping jaw has a Vickers hardness of more than 200 HV.

10. The power semiconductor module as claimed in claim 8, wherein the clamping jaw comprises a bent metal sheet.

11. The power semiconductor module as claimed in claim 8, wherein the clamping jaw comprises a sheet-metal strip bent to form a ring having opposing ends which are interlocked with one another.

12. The power semiconductor module as claimed in claim 1, wherein the accommodating region is delimited by the connecting element on at least one side, such that the connecting element is configured to directly contact the connecting region of the module-external connecting conductor upon the clamping element being situated in the second position.

13. The power semiconductor module as claimed in claim 1, further comprising:
a carrier on which at least one power semiconductor chip is arranged, the carrier having a heat dissipating contact area on a side facing away from the at least one power semiconductor chip; and
a housing, the clamping element being arranged at a side of the housing facing away from the heat dissipating contact area.

14. The power semiconductor module as claimed in claim 13, further comprising a ceramic substrate including a ceramic lamina with an upper metallization layer and a lower metallization layer, wherein the at least one power semiconductor chip is arranged on the upper metallization layer, and wherein either the heat dissipating contact area is provided by a side of the lower metallization layer facing away from the ceramic lamina, or the lower metallization is areally connected to a metallic baseplate having a side facing away from the ceramic lamina which forms the heat dissipating contact area.

15. A power semiconductor module system, comprising:
a power semiconductor module comprising:
an electrically conductive connecting element;
a clamping device comprising an accommodating region and a clamping element,
the clamping element configured to be brought from a first position into a second position; and
a module-external connecting conductor having a connecting region being configured for insertion into the accommodating region when the clamping element is situated in the first position, and
wherein the clamping device is configured to clamp the module-external connecting conductor to the power semiconductor module and to form an electrically conductive connection between the connecting element and the module-external connecting conductor when the connecting region is inserted into the accommodating region and the clamping element is subsequently brought from the first position into the second position by a first substantially planar surface of the clamping element sliding across a second substantially planar surface of the clamping device so as to displace the clamping element towards the connecting region of the module-external connecting conductor.

16. The power semiconductor module system as claimed in claim 15, wherein the module-external connecting conductor comprises a sheet-metal strip and the connecting region comprises a bent-over portion of the sheet-metal strip.

17. The power semiconductor module system as claimed in claim 15, wherein the connecting region has no through-openings.

18. The power semiconductor module system as claimed in claim 15, wherein the power semiconductor module further comprises a clamping jaw configured to press the connecting region of the module-external connecting conductor against the clamping jaw when the clamping element is situated in the second position.

19. The power semiconductor module system as claimed in claim 18, wherein the clamping jaw comprises a bent metal sheet.

20. The power semiconductor module system as claimed in claim 18, wherein the clamping jaw comprises a sheet-metal strip bent to form a ring having opposing ends which are interlocked with one another.

* * * * *